US012772736B2

(12) United States Patent
Ogura

(10) Patent No.: US 12,772,736 B2
(45) Date of Patent: Oct. 20, 2026

(54) VIBRATOR DEVICE

(71) Applicant: SEIKO EPSON CORPORATION, Tokyo (JP)

(72) Inventor: Seiichiro Ogura, Minowa (JP)

(73) Assignee: SEIKO EPSON CORPORATION (JP)

( * ) Notice: Subject to any disclaimer, the term of this patent is extended or adjusted under 35 U.S.C. 154(b) by 925 days.

(21) Appl. No.: 18/160,389

(22) Filed: Jan. 27, 2023

(65) Prior Publication Data

US 2023/0247907 A1 Aug. 3, 2023

(30) Foreign Application Priority Data

Jan. 28, 2022 (JP) ................................ 2022-011721

(51) Int. Cl.
*H10N 30/00* (2023.01)
*H10N 30/20* (2023.01)
*H10N 30/88* (2023.01)

(52) U.S. Cl.
CPC ......... *H10N 30/2041* (2023.02); *H10N 30/88* (2023.02)

(58) Field of Classification Search
CPC ............... H10N 30/2041; H10N 30/88; G01C 19/5733; H03H 9/05; H03H 9/10; H03H 9/132; H03H 9/19
See application file for complete search history.

(56) References Cited

U.S. PATENT DOCUMENTS

2020/0284815 A1* 9/2020 Ogura .................... H10N 30/87
2020/0292314 A1* 9/2020 Nishizawa ......... G01C 19/5656
2021/0135652 A1 5/2021 Ogura

FOREIGN PATENT DOCUMENTS

JP 2021-071370 A 5/2021

* cited by examiner

*Primary Examiner* — Julio C. Gonzalez
(74) *Attorney, Agent, or Firm* — Harness, Dickey & Pierce, P.L.C.

(57) ABSTRACT

A vibrator device includes a base, a vibrator element, a support substrate configured to support the vibrator element, and at least three bonding members which are arranged on the support substrate at a distance from each other, and which are configured to bond the support substrate and the base to each other, wherein the support substrate has a thin-wall portion, and the thin-wall portion is arranged between a pair of the bonding members adjacent to each other at a distance smaller than a distance between another pair of the bonding members adjacent to each other.

8 Claims, 7 Drawing Sheets

VIBRATOR DEVICE

The present application is based on, and claims priority from JP Application Serial Number 2022-011721, filed Jan. 28, 2022, the disclosure of which is hereby incorporated by reference herein in its entirety.

BACKGROUND

1. Technical Field

The present disclosure relates to a vibrator device.

2. Related Art

The vibrator device described in JP-A-2021-71370 (Document 1) is provided with a support substrate for fixing a vibrator element to a base, the support substrate has an edge part to be fixed to the base via a plurality of bonding members, an element mounting part for mounting the vibrator element, and a beam part for coupling the edge part and the element mounting part to each other, and the vibrator element is arranged above the element mounting part.

However, in the vibrator device described in Document 1, there is a problem that a significant thermal stress occurs between the support substrate and the bonding members, and between the bonding members and the base in accordance with a temperature variation due to a difference in thermal expansion coefficient between the support substrate and the base, and thus, the bonding members are separated from the support substrate or the base.

SUMMARY

A vibrator device includes a base, a vibrator element, a support substrate configured to support the vibrator element, and at least three bonding members which are arranged on the support substrate at a distance from each other, and which are configured to bond the support substrate and the base to each other, wherein the support substrate has a thin-wall portion, and the thin-wall portion is arranged between a pair of the bonding members adjacent to each other at a distance smaller than a distance between another pair of the bonding members adjacent to each other.

DESCRIPTION OF EXEMPLARY EMBODIMENTS

1. First Embodiment

Figure 1:
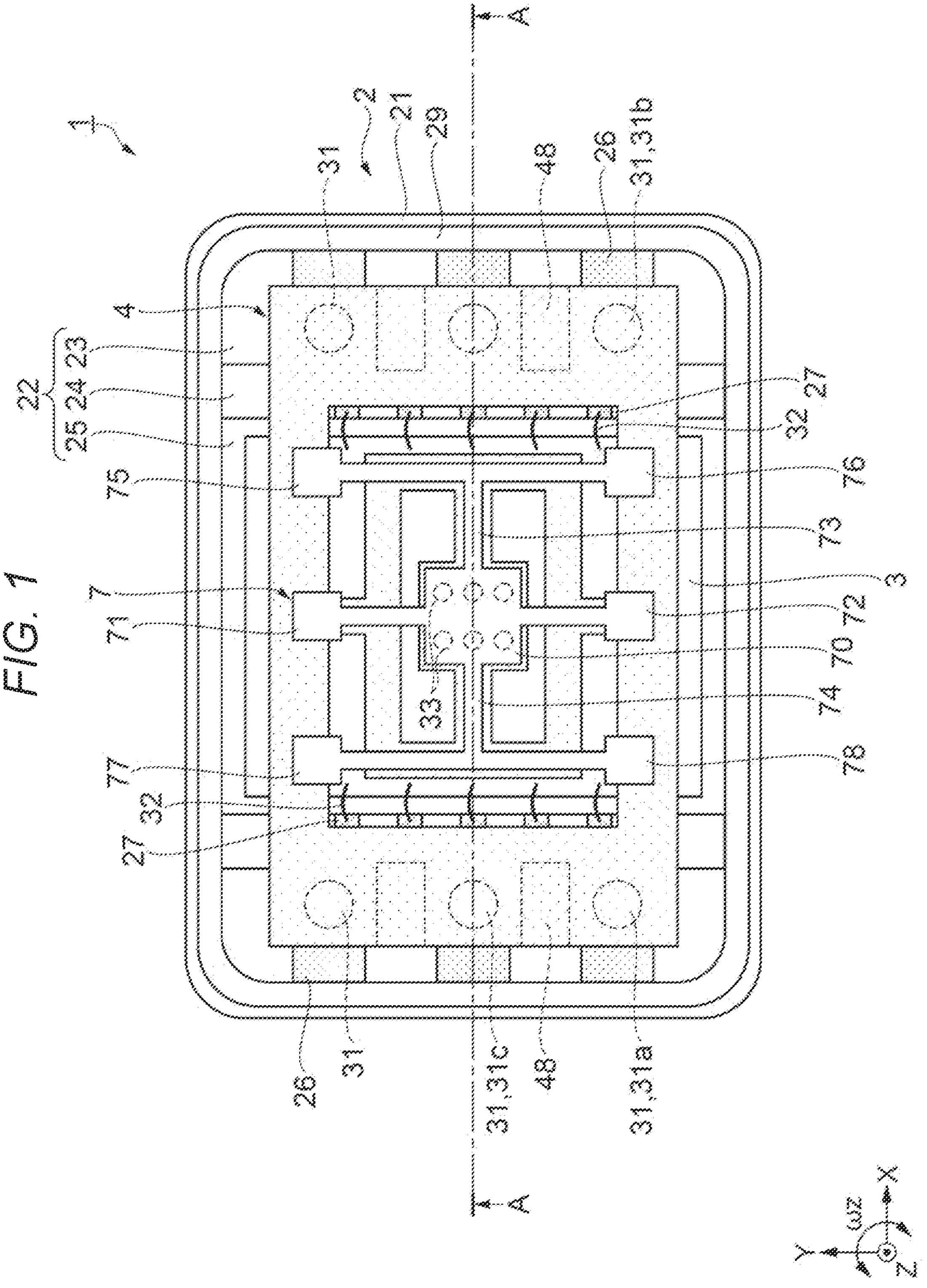
FIG. 1 is a plan view showing a schematic structure of a vibrator device according to a first embodiment.

First, a vibrator device 1 according to a first embodiment will be described with reference to FIG. 1 through FIG. 4.

It should be noted that the vibrator device 1 will be described citing a gyro sensor for detecting angular velocity around a Z axis as an example. Further, in FIG. 1, a state in which the lid 30 is detached is illustrated for the sake of convenience of explanation. Further, in FIG. 1 and FIG. 2, the illustration of interconnections for electrically coupling terminals provided to a base 21, and the illustration of terminals and interconnections provided to a support substrate 4 and a vibrator element 7 are omitted. Further, in FIG. 3 and FIG. 4, the illustration of the terminals and the interconnections provided to the support substrate 4 is omitted.

Further, in the following plan view and the following cross-sectional view, there are illustrated an X axis, a Y axis, and a Z axis as three axes perpendicular to each other. Further, a direction along the X axis is referred to as an "X direction," a direction along the Y axis is referred to as a "Y direction," and a direction along the Z axis is referred to as a "Z direction," and an arrow side of each of the axes is referred to as a "positive side," and an opposite side to the arrow is referred to as a "negative side." Further, the positive side in the Z axis is also referred to as an "upper side," and the negative side is also referred to as a "lower side." Further, the plan view from a thickness direction of the support substrate 4, namely the Z direction, is also referred to simply as a "plan view."

Figure 2:
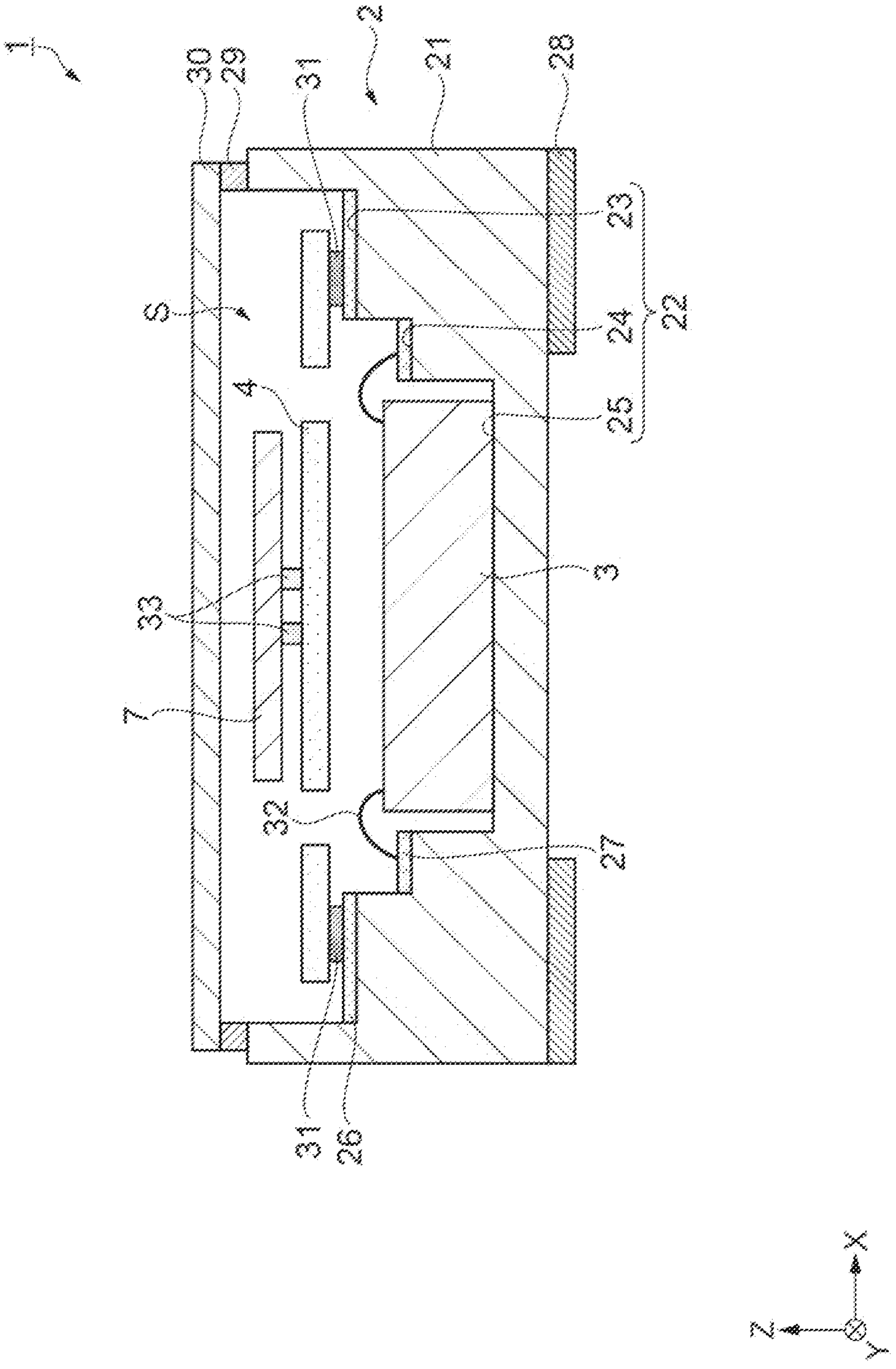
FIG. 2 is a cross-sectional view along the line A-A in FIG. 1.

As shown in FIG. 1 and FIG. 2, the vibrator device 1 according to the present embodiment is provided with the base 21 constituting a package 2, a circuit element 3 housed in the package 2, the support substrate 4 for supporting the vibrator element 7, the vibrator element 7, and at least three bonding members 31 which are arranged on the support substrate 4 at intervals, and which bond the support substrate 4 and the base 21 to each other. It should be noted that in the present embodiment, the vibrator device 1 having six bonding members 31 is cited as an example, and is described.

The package 2 has the base 21 provided with a recessed part 22 opening on an upper surface, and the lid 30 which is bonded to the upper surface of the base 21 via a bonding member 29 so as to close the opening of the recessed part 22. The recessed part 22 forms an internal space S inside the package 2, and the circuit element 3, the support substrate 4, and the vibrator element 7 are housed in the internal space S. For example, the base 21 can be formed of ceramics such as alumina, and the lid 30 can be formed of a metal material such as Kovar. It should be noted that the constituent materials of the base 21 and the lid 30 are not particularly limited.

The internal space S is airtightly sealed, and is set in a reduced-pressure state, and preferably a state more approximate to a vacuum state. Thus, the viscosity resistance reduces, and the vibration characteristics of the vibrator element 7 are improved. It should be noted that the atmosphere in the internal space S is not particularly limited, and can also be, for example, in the atmospheric pressure state or a pressurized state.

Further, the recessed part 22 is constituted by a plurality of recessed parts 23, 24, and 25 arranged side by side in the Z direction, wherein the plurality of recessed parts 23, 24, and 25 correspond to a first recessed part 23 opening on the upper surface of the base 21, a second recessed part 24 which opens on a bottom surface of the first recessed part 23, and is smaller in opening width than the first recessed part 23, and a third recessed part 25 which opens on a bottom surface of the second recessed part 24, and is smaller in opening width than the second recessed part 24. Further, to the bottom surface of the first recessed part 23, there is fixed the support substrate 4 in a state of supporting the vibrator element 7, and to a bottom surface of the third recessed part 25, there is fixed the circuit element 3.

Further, in the internal space S, the vibrator element 7, the support substrate 4, and the circuit element 3 are arranged so as to overlap each other in a plan view. In other words, the vibrator element 7, the support substrate 4, and the circuit element 3 are arranged side by side along the Z direction. Thus, it is possible to suppress the planar spread towards the X direction and the Y direction of the package 2, and thus, it is possible to achieve reduction in size of the vibrator device 1. Further, the support substrate 4 is located between the vibrator element 7 and the circuit element 3, and supports the vibrator element 7 so as to hold the vibrator element 7 from the lower side, namely the Z-axis negative side.

Further, as shown in FIG. 1 and FIG. 2, on the bottom surface of the first recessed part 23, there is arranged a plurality of internal terminals 26, on the bottom surface of the second recessed part 24, there is arranged a plurality of internal terminals 27, and on the lower surface of the base 21, there is arranged a plurality of external terminals 28. The internal terminals 26, 27 and the external terminals 28 described above are electrically coupled via interconnections not shown formed inside the base 21 in accordance with a circuit design. Further, the internal terminals 26 are electrically coupled to the vibrator element 7 via bonding members 31, 32 having electrical conductivity and the support substrate 4, and the internal terminals 27 are electrically coupled to the circuit element 3 via bonding wires 32.

The circuit element 3 is fixed to the bottom surface of the third recessed part 25. The circuit element 3 includes a drive circuit and a detection circuit for driving the vibrator element 7 to detect the angular velocity ωz applied to the vibrator element 7. It should be noted that the circuit element 3 is not particularly limited, and can include other circuits such as a temperature compensation circuit.

Further, as shown in FIG. 2, the support substrate 4 intervenes between the base 21 and the vibrator element 7. The support substrate 4 mainly has a function of absorbing or relaxing the stress caused by a deformation of the base 21 to thereby make it difficult for the stress to reach the vibrator element 7.

Figure 3:
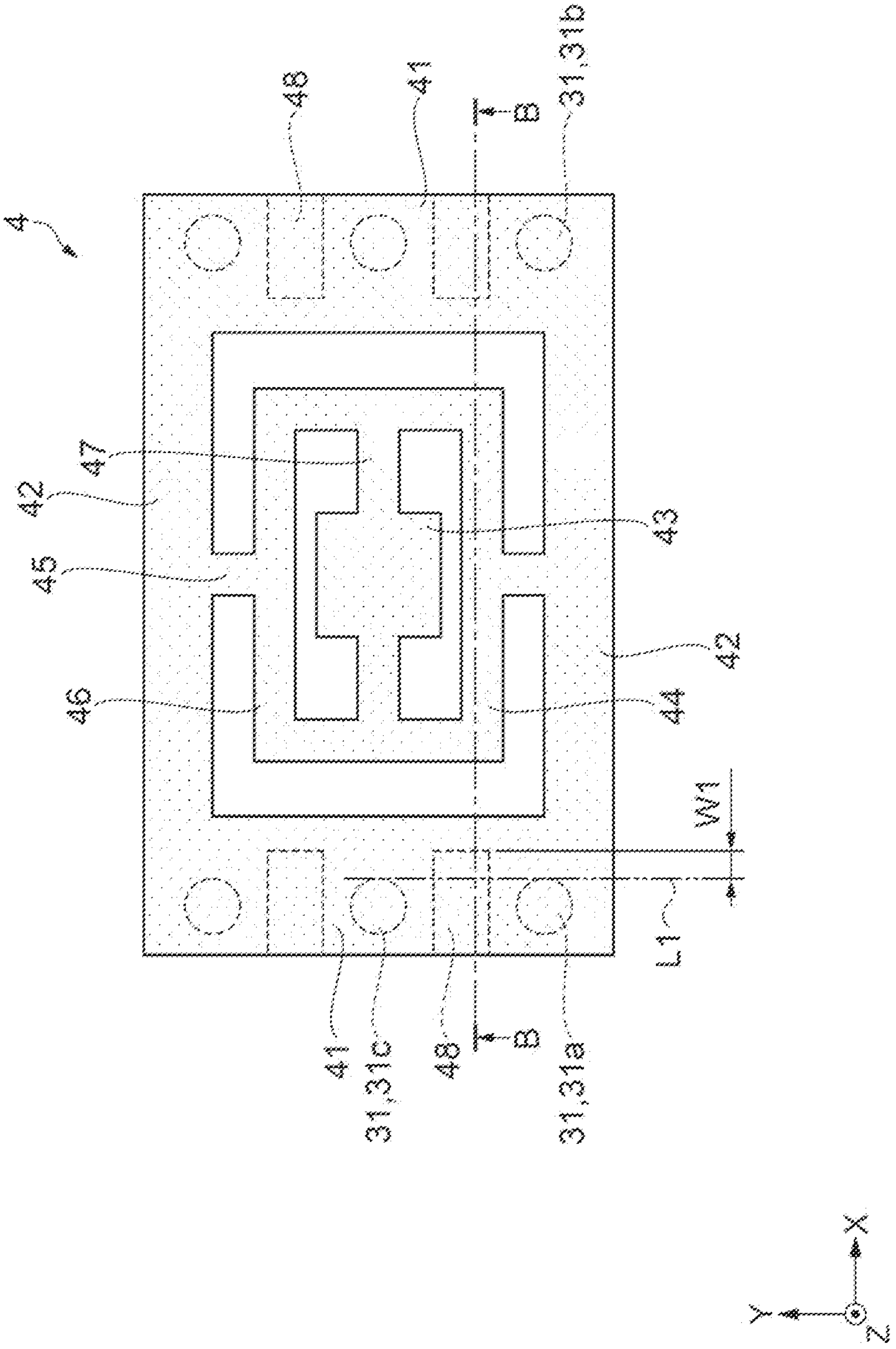
FIG. 3 is a plan view showing a schematic structure of a support substrate provided to the vibrator device according to the first embodiment.
Figure 4:
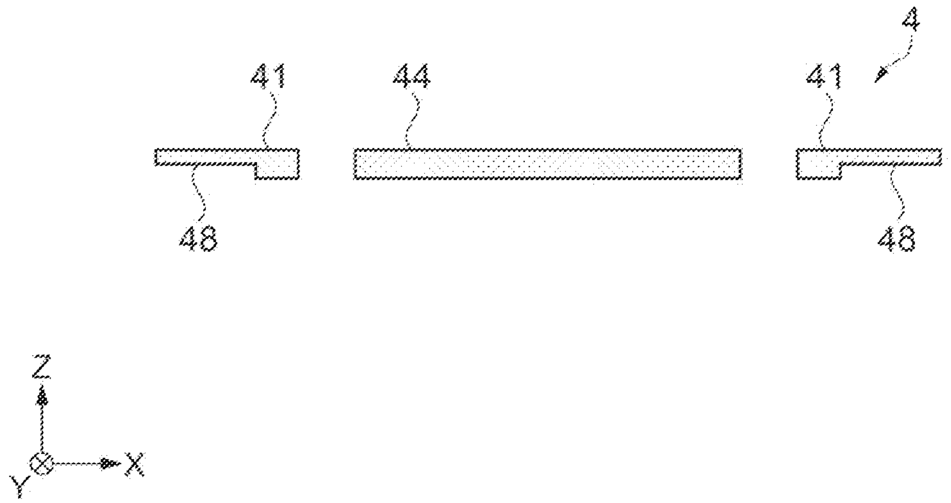
FIG. 4 is a cross-sectional view along the line B-B in FIG. 3.

Such a support substrate 4 is provided with a gimbal structure. As shown in FIG. 3 and FIG. 4, the support substrate 4 has an element support part 43 for supporting the vibrator element 7, base fixation parts 41 which are located outside the element support part 43, and are fixed to the base 21, two coupling parts 42 for coupling the two base fixation parts 41 arranged in the X direction to each other at both ends thereof in the Y direction, and a beam part 44 which is located between the element support part 43 and the base fixation parts 41, which is shaped like a frame surrounding the element support part 43, and which couples the base fixation parts 41 and the element support part 43 to each other via the coupling parts 42 in the plan view from the Z direction. The beam part 44 has a pair of inner beam parts 47 which extend toward both sides in the X direction from the element support part 43, and which couple the element support part 43 and a frame part 46 to each other, a frame part 46 shaped like a frame surrounding the element support part 43, and a pair of outer beam parts 45 which extend toward both sides in the Y direction from the frame part 46, and which couple the frame part 46 and a coupling part 42 for coupling two base fixation parts 41 to each other.

Further, the pair of inner beam parts 47 are located at the X-direction both sides of the element support part 43, and couple the element support part 43 and the frame part 46 to each other so as to achieve a fixed-fixed support of the element support part 43.

Further, the pair of outer beam parts 45 are located at the Y-direction both sides of the frame part 46, and couple the frame part 46 and the coupling parts 42 to each other so as to achieve a fixed-fixed support of the frame part 46.

By making the extending direction of the inner beam parts 47 and the extending direction of the outer beam parts 45 perpendicular to each other as described above, it is possible to effectively absorb or relax the stress transmitted from the base 21 using the support substrate 4.

In such a support substrate 4, a base part 70 of the vibrator element 7 is fixed to an upper surface of the element support part 43 via six bonding members 33 having electrical conductivity such as metal bumps, and the base fixation parts 41 are fixed to the bottom surface of the first recessed part 23 via six bonding members 31. In other words, the support substrate 4 and the base 21 are electrically coupled to each other via the bonding members 31 as electrically-conductive bonding members. More specifically, the base fixation part 41 located at the X-direction negative side is fixed to the bottom surface of the first recessed part 23 via the three bonding members 31, and the base fixation part 41 located at the X-direction positive side is fixed to the bottom surface of the first recessed part 23 via the three bonding members 31. By making the support substrate 4 intervene between the vibrator element 7 and the base 21 as described above, it is possible to absorb or relax the stress transmitted from the base 21 using the support substrate 4, and thus, it becomes difficult for the stress to reach the vibrator element 7. Therefore, it is possible to effectively prevent the degradation and the fluctuation of the vibration characteristics of the vibrator element 7.

Further, as shown in FIG. 3, the support substrate 4 has thin-wall portions 48, and each of the thin-wall portions 48 is arranged between two bonding members 31 adjacent to each other at a distance smaller than a distance between other bonding members 31 adjacent to each other. Specifically, in the first bonding member 31*a* and the third bonding member 31*c* arranged on the base fixation part 41 at the X-direction negative side, and the second bonding member 31*b* arranged on the base fixation part 41 at the X-direction positive side, the thin-wall portion 48 is arranged between the first bonding member 31*a* and the third bonding member 31*c* which are arranged at a distance smaller than the distance between the first bonding member 31*a* and the second bonding member 31*b* adjacent to each other.

The thin-wall portions 48 are each formed from an outer shape end of the support substrate 4 toward the inside of the support substrate 4, and are each formed beyond a first imaginary line L1 connecting outer shape positions of the two bonding members 31 at an inner side which is an opposite side to the outer shape side of the support substrate 4. In other words, the thin-wall portions 48 are each formed toward the inside of the support substrate 4 beyond the first imaginary line L1 so as to have a length W1.

Further, as shown in FIG. 4, the thin-wall portions 48 are each recessed toward the Z-direction positive side, and the plate thickness of the thin-wall portions 48 is thinner compared to the plate thickness of the beam part 44 of the support substrate 4. By disposing the thin-wall portion 48 between the two bonding members 31 adjacent to each other as described above, it is possible to weaken the rigidity of the support substrate 4 between the two bonding members 31.

It should be noted that in the present embodiment, the two thin-wall portions 48 are disposed between the three bonding members 31 arranged in the base fixation part 41 at the X-direction negative side, and the two thin-wall portions 48 are disposed between the three bonding members 31 arranged in the base fixation part 41 at the X-direction positive side.

Since the thin-wall portions 48 are disposed in the base fixation parts 41 of the support substrate 4 as described above, when fixing the support substrate 4 to the base 21 via the bonding members 31, the thermal stress due to a difference in thermal expansion coefficient between the support substrate 4 and the base 21 generated between the two bonding members 31 adjacent to each other can be reduced due to a deflection or an extension of the thin-wall portion 48, and thus, it is possible to prevent the bonding members 31 from being separated from the support substrate 4 or the base 21.

Such a support substrate 4 is formed of a Z-cut quartz crystal substrate constituting the vibrator element 7 described later. By forming the support substrate 4 from the quartz crystal substrate similarly to the vibrator element 7 as described above, it is possible to make the support substrate 4 and the vibrator element 7 equal in thermal expansion coefficient to each other. Therefore, the thermal stress caused by the difference in thermal expansion coefficient from each other does not substantially occur between the support substrate 4 and the vibrator element 7, and it becomes more difficult for the vibrator element 7 to be subjected to stress. Therefore, it is possible to more effectively prevent the degradation and the fluctuation of the vibration characteristics of the vibrator element 7.

It should be noted that the support substrate 4 is not limited thereto, but can also be, for example, different in directions of the crystal axes from the vibrator element 7 although the same in cutting angle as the vibrator element 7. Further, the support substrate 4 can also be formed of a quartz crystal substrate different in cutting angle from the vibrator element 7. Further, the support substrate 4 is not required to be formed of the quartz crystal substrate, and in this case, the support substrate 4 can be formed of, for example, a silicon substrate or a resin substrate. In this case, it is preferable for the constituent material of the support substrate 4 to be a material having a difference in thermal expansion coefficient from quartz crystal smaller than a difference in thermal expansion coefficient between quartz crystal and the constituent material of the base 21.

As shown in FIG. 1, the vibrator element 7 has the base part 70 located in a central portion, a pair of detecting vibrating arms 71, 72 extending in the Y direction from the base part 70, a pair of coupling arms 73, 74 extending in the X direction from the base part 70 so as to be perpendicular to the detecting vibrating arms 71, 72, a pair of driving vibrating arms 75, 76 extending in the Y direction from a tip side of the coupling arm 73, and a pair of driving vibrating arms 77, 78 extending in the Y direction from a tip side of the coupling arm 74, so as to be parallel to the detecting vibrating arms 71, 72. The vibrator element 7 is electrically and mechanically fixed to the upper surface of the element support part 43 of the support substrate 4 via the coupling members 33 having electrical conductivity in the base part 70.

When the angular velocity ωz around the Z axis is applied to the vibrator element 7 in a state in which the pair of driving vibrating arms 75, 76 and the pair of driving vibrating arms 77, 78 perform flexural vibration in the X direction in respective phases reversed from each other, a Coriolis force acts on the pair of driving vibrating arms 75, 76, the pair of driving vibrating arms 77, 78, and the coupling arms 73, 74, and thus, the vibrator element 7 vibrates in the Y direction. Due to this vibration, the pair of detecting vibrating arms 71, 72 flexurally vibrate in the X direction. Therefore, the angular velocity wz is obtained by detection electrodes provided to the pair of detecting vibrating arms 71, 72 detecting a distortion in quartz crystal generated by the vibration as an electrical signal.

It should be noted that the vibrator element 7 is formed of a Z-cut quartz crystal substrate. The Z-cut quartz crystal substrate has spread in an X-Y plane defined by the X axis as an electrical axis and the Y axis as a mechanical axis, and has a thickness in a direction along the Z axis as an optical axis, wherein the electrical axis, the mechanical axis, and the optical axis are the crystal axes of quartz crystal.

The bonding members 31, 33 are not particularly limited as long as the bonding members 31, 33 are each made of an electrically-conductive bonding member provided with both of the electrical conductivity and the bonding property, and it is possible to use, for example, a variety of metal bumps such as gold bumps, silver bumps, copper bumps, or solder bumps, or an electrically-conductive adhesive having an electrically-conductive filler such as a silver filler dispersed in an adhesive of a variety of types such as a polyimide type, an epoxy type, a silicone type, or an acrylic type. When the metal bumps as the former party are used as the bonding members 31, 33, it is possible to inhibit a gas from being generated from the bonding members 31, 33, and it is possible to effectively prevent a change in environment, in particular rise in pressure, of the internal space S. On the other hand, when the electrically-conductive adhesive as the latter party is used as the bonding members 31, 33, the bonding members 31, 33 become relatively soft, and it is possible to absorb or relax the stress described above also in the bonding members 31, 33.

In the present embodiment, the electrically-conductive adhesive is used as the bonding members 31, and the metal bumps are used as the bonding members 33. By using the electrically-conductive adhesive as the bonding members 31 for bonding the support substrate 4 and the base 21 as materials different in type from each other, the thermal stress caused by the difference in thermal expansion coefficient therebetween can effectively be absorbed or relaxed by the bonding members 31. On the other hand, since the support substrate 4 and the vibrator element 7 are bonded to each other with six bonding members 33 disposed in a relatively small area, by using the metal bumps as the bonding members 33, wetting spread which occurs in the case of the electrically-conductive adhesive is inhibited, and thus, it is possible to effectively prevent the bonding members 33 from making contact with each other.

As described hereinabove, in the vibrator device 1 according to the present embodiment, the thermal stress applied to the bonding members 31 becomes particularly high in the two bonding members 31 adjacent to each other at a distance smaller than the distance between other bonding members 31 adjacent to each other, and the thin-wall portions 48 are each arranged between such two bonding members 31 in the base fixation part 41 of the support substrate 4. Therefore, the thermal stress due to the difference in thermal expansion coefficient between the support substrate 4 and the base 21 generated between the two bonding members 31 adjacent to each other can effectively be reduced by the deflection or the extension of the thin-wall portion 48, and thus, it is possible to effectively inhibit the bonding members 31 from being separated from the support substrate 4 or the base 21. Therefore, it is possible to obtain the vibrator device 1 excellent in reliability.

2. Second Embodiment

Then, a vibrator device 1*a* according to a second embodiment will be described with reference to FIG. 5. It should be noted that in FIG. 5, the illustration of interconnections provided to a support substrate 4*a* is omitted.

The vibrator device 1*a* according to the present embodiment is substantially the same as the vibrator device 1 according to the first embodiment except the fact that shapes of thin-wall portions 48*a* provided to the support substrate 4*a* are different compared to the vibrator device 1 according to the first embodiment. It should be noted that the description will be presented with a focus on the difference from the first embodiment described above, and the description of substantially the same issues will be omitted.

Figure 5:
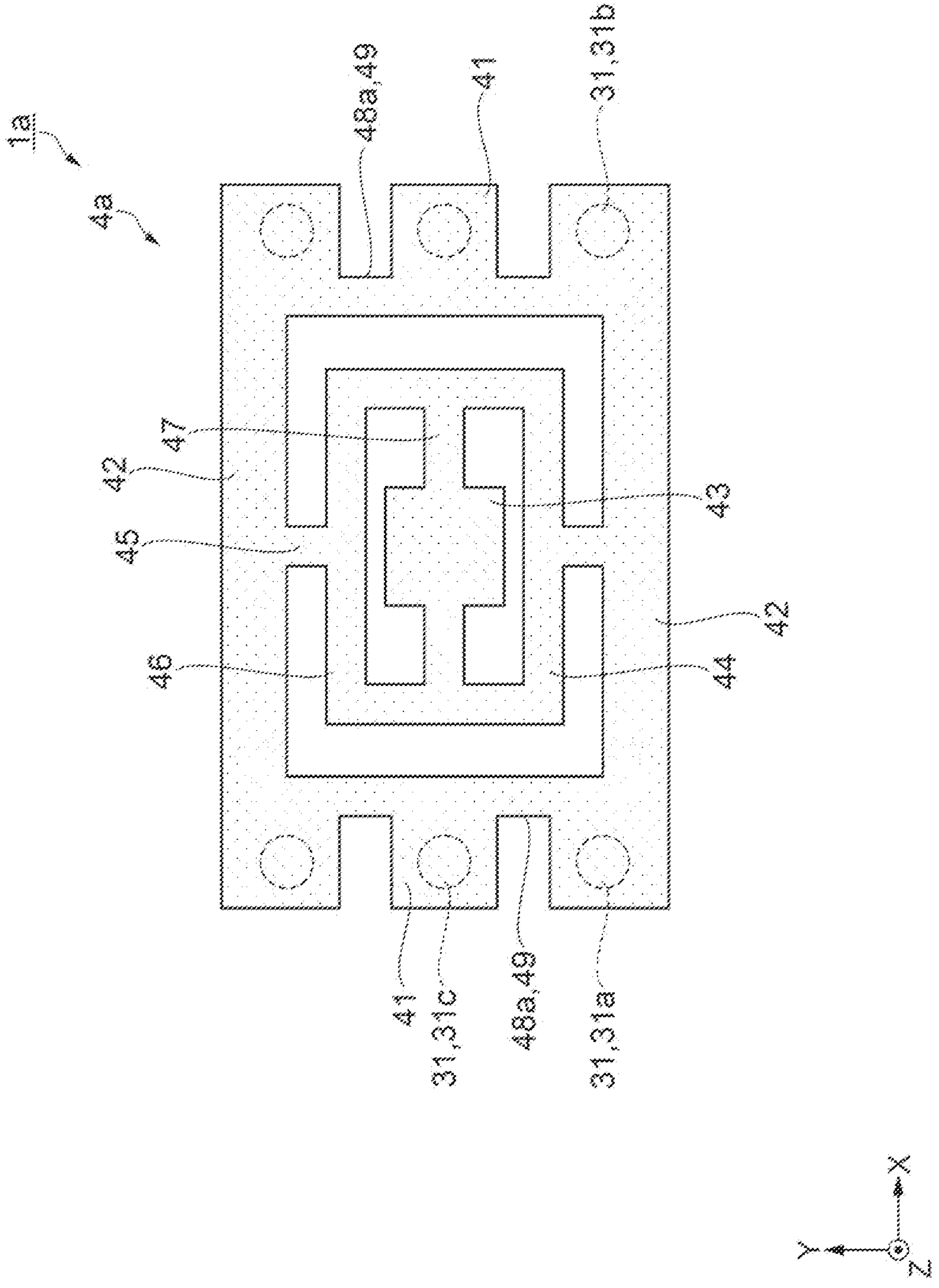
FIG. 5 is a plan view showing a schematic structure of a support substrate provided to a vibrator device according to a second embodiment.

As shown in FIG. 5, in the vibrator device 1*a*, each of the thin-wall portions 48*a* disposed between the two bonding members 31 adjacent to each other is a cutout part 49 penetrating in the thickness direction. In other words, the thin-wall portions 48*a* penetrate in the Z direction as the thickness direction of the support substrate 4*a*. Therefore, it is possible to further weaken the rigidity of the support substrate 4*a* between the two bonding members 31 adjacent to each other compared to when the thin-wall portions 48 are each the thin plate in the first embodiment.

By adopting such a configuration, there can be obtained advantages equivalent to those of the vibrator device 1 according to the first embodiment.

3. Third Embodiment

Then, a vibrator device 1*b* according to a third embodiment will be described with reference to FIG. 6. It should be noted that in FIG. 6, the illustration of interconnections provided to a support substrate 4*b* is omitted.

The vibrator device 1*b* according to the present embodiment is substantially the same as the vibrator device 1 according to the first embodiment except the fact that shapes of thin-wall portions 48*b* provided to the support substrate 4*b* are different compared to the vibrator device 1 according to the first embodiment. It should be noted that the description will be presented with a focus on the difference from the first embodiment described above, and the description of substantially the same issues will be omitted.

Figure 6:
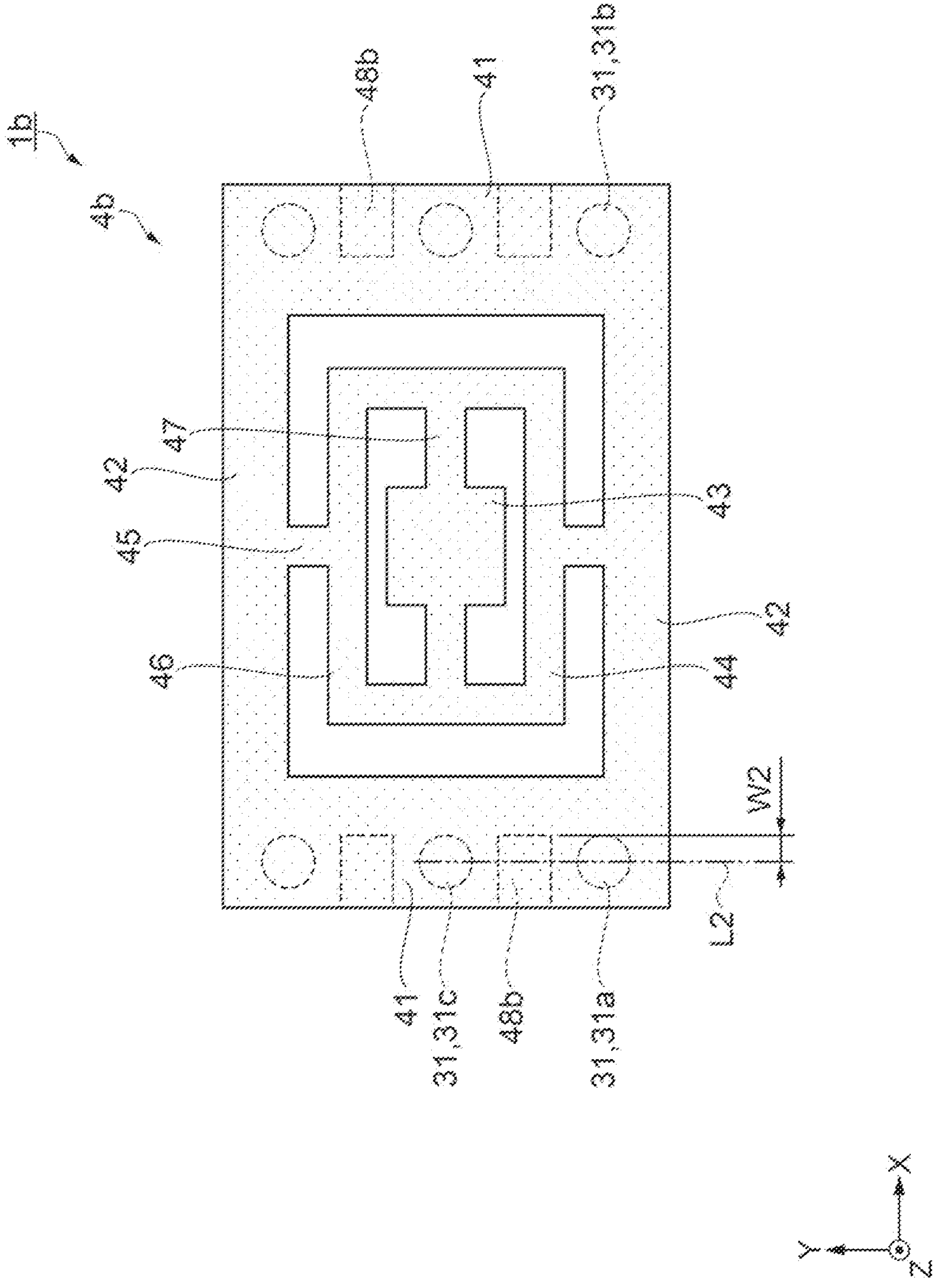
FIG. 6 is a plan view showing a schematic structure of a support substrate provided to a vibrator device according to a third embodiment.

As shown in FIG. 6, in the vibrator device 1*b*, the thin-wall portions 48*b* are each formed in an area from an outer shape end of the support substrate 4*b* toward the inside of the support substrate 4*b*, and is formed beyond a second imaginary line L2 connecting the outer shape centers of the two bonding members 31 to each other. In other words, the thin-wall portions 48*b* are each formed toward the inside of the support substrate 4*b* beyond the second imaginary line L2 so as to have a length W2. Therefore, it is possible to weaken the rigidity of the support substrate 4*b* between the two bonding members 31 adjacent to each other.

By adopting such a configuration, there can be obtained advantages equivalent to those of the vibrator device 1 according to the first embodiment.

4. Fourth Embodiment

Then, a vibrator device 1*c* according to a fourth embodiment will be described with reference to FIG. 7. It should be noted that in FIG. 7, the illustration of interconnections provided to a support substrate 4*c* is omitted.

The vibrator device 1*c* according to the present embodiment is substantially the same as the vibrator device 1 according to the first embodiment except the fact that shapes of thin-wall portions 48*c* provided to the support substrate 4*c* are different compared to the vibrator device 1 according to the first embodiment. It should be noted that the description will be presented with a focus on the difference from the first embodiment described above, and the description of substantially the same issues will be omitted.

Figure 7:
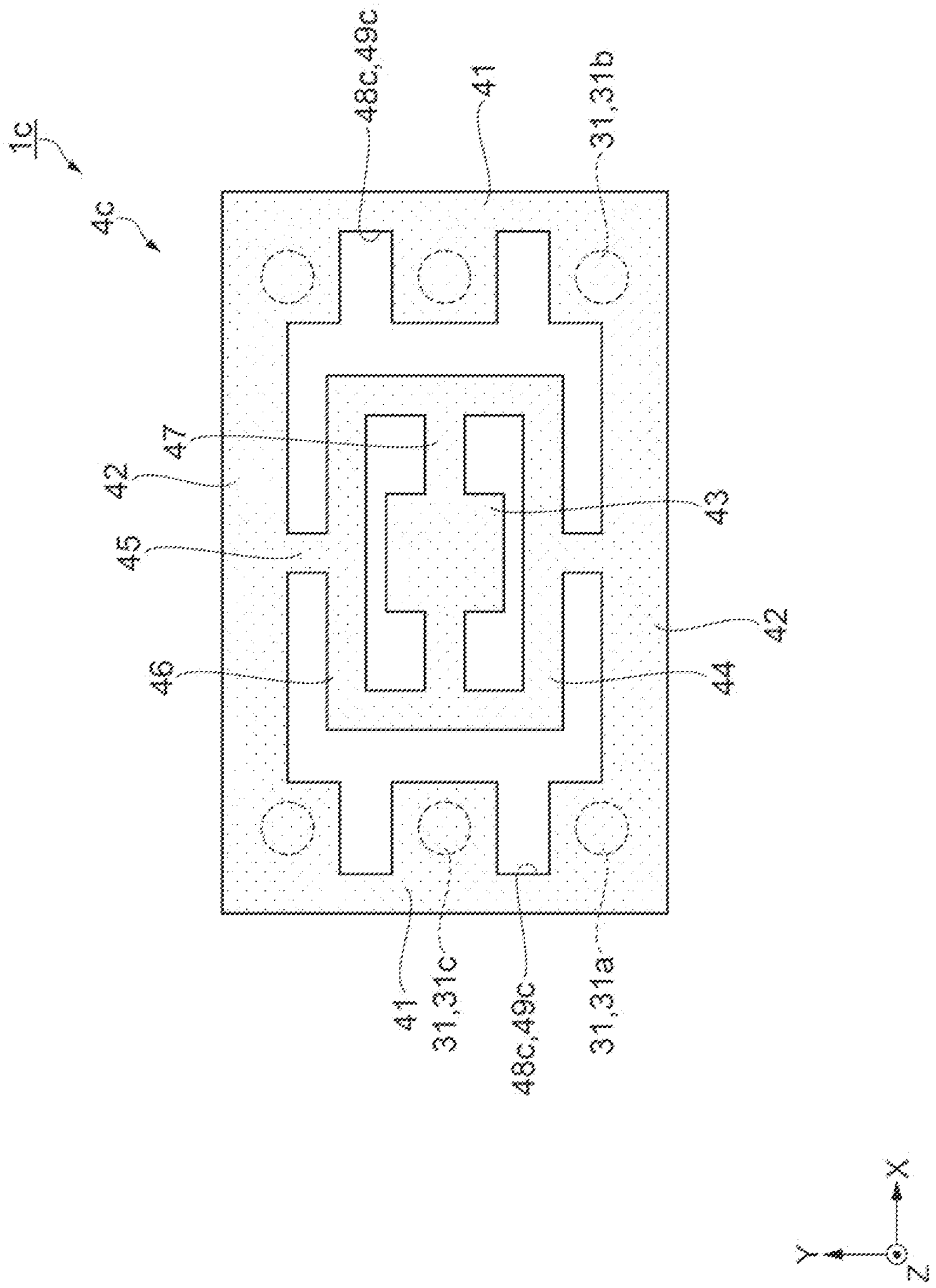
FIG. 7 is a plan view showing a schematic structure of a support substrate provided to a vibrator device according to a fourth embodiment.

As shown in FIG. 7, in the vibrator device 1*c*, each of the thin-wall portions 48*c* disposed between the two bonding members 31 adjacent to each other is formed in an area from an inner end of the base fixation part 41 toward the outer shape end of the support substrate 4*c*. Further, the thin-wall portions 48*c* are each a cutout part 49*c* penetrating in the thickness direction. In other words, the thin-wall portions 48*c* penetrate in the Z direction as the thickness direction of the support substrate 4*c*. Therefore, it is possible to weaken the rigidity of the support substrate 4*c* between the two bonding members 31 adjacent to each other.

By adopting such a configuration, there can be obtained advantages equivalent to those of the vibrator device 1 according to the first embodiment.

What is claimed is:

1. A vibrator device comprising:

a base;

a vibrator element;

a support substrate supporting the vibrator element, the support substrate being configured with a first part and a second part, the first and second parts having first and second thicknesses, respectively, the first thickness being smaller than the second thickness; and first, second, and third bonding members arranged on the support substrate and bonding the support substrate and the base to each other, the first and third bonding members being spaced apart from each other by a first distance in a plan view, the first and second bonding members being spaced apart from each other by a second distance in the plan view, the second and third bonding members being spaced apart from each other by a third distance in the plan view, the first distance being smaller than each of the second and third distances, wherein the first part of the support substrate is located directly adjacent to and between the first and third bonding members in the plan view.

2. The vibrator device according to claim 1, wherein the first part of the support substrate is a cutout part penetrating through the support substrate.

3. The vibrator device according to claim 1, wherein the first part of the support substrate is formed in an area from an outer edge of the support substrate toward an inner position located at an inside of the support substrate, the first part of the support substrate has a first end and a second end outwardly opposite to each other in the plan view, and the first end of the first part is located at the outer edge of the support substrate, and the second end of the first part is located at the inner position of the support substrate.

4. The vibrator device according to claim 3, wherein each of the first and third bonding members has an outer end and an inner end outwardly opposite to each other in the plan view, the outer end of each of the first and third bonding members is directly adjacent to the outer edge of the support substrate, and the inner end of each of the first and third bonding members is located at the inside of the support substrate, a linear line connecting between the inner end of the first bonding member and the inner end of the third bonding member is defined as a first imaginary line in the plan view, and the second end of the first part of the support substrate is located far away from the outer edge of the support substrate toward the inside of the support substrate than the first imaginary line in the plan view.

5. The vibrator device according to claim 3, wherein a linear line connecting between a center of the first bonding member and a center of the third bonding member is defined as a second imaginary line in the plan view, and the second end of the first part of the support substrate is located far away from the outer edge of the support substrate toward the inside of the support substrate than the second imaginary line in the plan view.

6. The vibrator device according to claim 1, wherein the support substrate is configured with:

a base fixation part in which the first, second, and third bonding members are arranged;

an element support part supporting the vibrator element; and a beam part continuously extending from the base fixation part and the element support part and coupling the base fixation part and the element support part together as a monolithic structure of the support substrate.

7. The vibrator device according to claim 1, wherein the support substrate is configured with:

a base fixation part in which the first, second, and third bonding members are arranged;

an element support part supporting the vibrator element; and a beam part continuously extending from the base fixation part and the element support part and coupling the base fixation part and the element support part together as a monolithic structure of the support substrate, and the first part of the support substrate is formed in an area from an inner end of the base fixation part toward an outer edge of the support substrate.

8. The vibrator device according to claim 1, wherein the first, second, and third bonding members are electrically-conductive bonding members configured to electrically couple the support substrate and the base to each other.

* * * * *